United States Patent
Sakui

(10) Patent No.: US 9,553,103 B2
(45) Date of Patent: *Jan. 24, 2017

(54) MEMORY CELL PROFILES

(71) Applicant: Micron Technology, Inc., Boise, ID (US)

(72) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/593,475

(22) Filed: Jan. 9, 2015

(65) Prior Publication Data

US 2016/0013204 A1   Jan. 14, 2016

Related U.S. Application Data

(63) Continuation of application No. 13/369,822, filed on Feb. 9, 2012, now Pat. No. 8,957,495.

(51) Int. Cl.
*H01L 21/70* (2006.01)
*H01L 27/115* (2006.01)
*H01L 29/788* (2006.01)

(52) U.S. Cl.
CPC ... *H01L 27/11582* (2013.01); *H01L 27/11519* (2013.01); *H01L 27/11556* (2013.01); *H01L 27/11565* (2013.01); *H01L 29/7889* (2013.01)

(58) Field of Classification Search
CPC .................................................. H01L 27/105
See application file for complete search history.

(56) References Cited

U.S. PATENT DOCUMENTS

| | | |
|---|---|---|
| 6,501,123 B2 | 12/2002 | Liu |
| 6,870,215 B2 | 3/2005 | Endoh et al. |
| 7,019,353 B2 | 3/2006 | Lindsay et al. |
| 7,482,223 B2 | 1/2009 | Higashitani et al. |
| 7,662,720 B2 | 2/2010 | Kim et al. |
| 8,033,043 B2 | 10/2011 | McGarry |
| 2005/0199937 A1 | 9/2005 | Chang |
| 2006/0234449 A1 | 10/2006 | Smayling |
| 2007/0264776 A1* | 11/2007 | Dong ............... H01L 21/28273 438/257 |
| 2007/0272973 A1* | 11/2007 | Park ...................... B82Y 10/00 257/324 |
| 2008/0023595 A1 | 1/2008 | Armaly |
| 2009/0179479 A1 | 7/2009 | Davis et al. |
| 2010/0226195 A1 | 9/2010 | Lue |

(Continued)

OTHER PUBLICATIONS

Sakui, Koji et al. "Design Impacts on NAND Flash Memory Core Circuits with Vertical MOSFETs". Memory Workshop (IMW), 2010 IEEE International, May 16-19, 2010, pp. 84-87.

*Primary Examiner* — Mohsen Ahmadi
*Assistant Examiner* — Ismail Muse
(74) *Attorney, Agent, or Firm* — Brooks, Cameron & Huebsch, PLLC

(57) ABSTRACT

Examples of the present disclosure provide devices and methods for processing a memory cell. A method embodiment includes removing a key-hole shaped column from a material, to define a profile for the memory cell. The method also includes partially filling the key-hole shaped column with a first number of materials. The method further includes filling the remaining portion of the key-hole shaped column with a second number of materials.

19 Claims, 8 Drawing Sheets

(56) References Cited

U.S. PATENT DOCUMENTS

| | | |
|---|---|---|
| 2011/0051512 A1 | 3/2011 | Violette |
| 2011/0073935 A1 | 3/2011 | Sekihara et al. |
| 2011/0193153 A1 | 8/2011 | Higuchi et al. |
| 2011/0248334 A1 | 10/2011 | Sandhu et al. |
| 2012/0049268 A1* | 3/2012 | Chang ............... H01L 21/28273 257/324 |
| 2013/0043455 A1* | 2/2013 | Bateman ............. H01L 27/2454 257/5 |

* cited by examiner

MEMORY CELL PROFILES

PRIORITY INFORMATION

This application is a Continuation of U.S. application Ser. No. 13/369,822, filed Feb. 9, 2012, the contents of which are included herein by reference.

TECHNICAL FIELD

The present disclosure relates generally to semiconductor memory apparatuses and methods, and more particularly, to memory devices and methods of making the device with an increased coupling ratio compared to some previous approaches.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), resistive random access memory (RRAM), phase change random access memory (PCRAM), magnetic random access memory (MRAM), and flash memory, among others.

Uses for flash memory include memory for solid state drives (SSDs), personal computers, personal digital assistants (PDAs), digital cameras, cellular telephones, portable music players (e.g., MP3 players), and movie players, among various other electronic apparatuses. Flash memory cells can be organized in an array architecture (e.g., a NAND or NOR architecture) and can be programmed to a target (e.g., desired) data state. For instance, electric charge can be placed on or removed from a charge storage structure (e.g., a floating gate or a charge trap) of a memory cell to program the cell into one of two data states, such as to represent one of two binary digits (e.g., 1 or 0).

Flash memory cells can also be programmed to one of more than two data states, such as to represent one of, for example, 1111, 0111, 0011, 1011, 1001, 0001, 0101, 1101, 1100, 0100, 0000, 1000, 1010, 0010, 0110, and 1110. Such cells may be referred to as multi state memory cells, multiunit cells, or multilevel cells (MLCs). MLCs can allow the manufacture of higher density memories without increasing the number of memory cells since each cell can represent more than one digit (e.g., more than one bit). One of the data states can be an erased state.

Another technique for allowing the manufacture of higher density memories may include stacking memory cells in a vertical arrangement (creating a "3D" architecture). As the memory cells are scaled down in size and densities of such devices increase, manufacture and functionality of such devices may introduce challenges.

DETAILED DESCRIPTION

Figure 1:
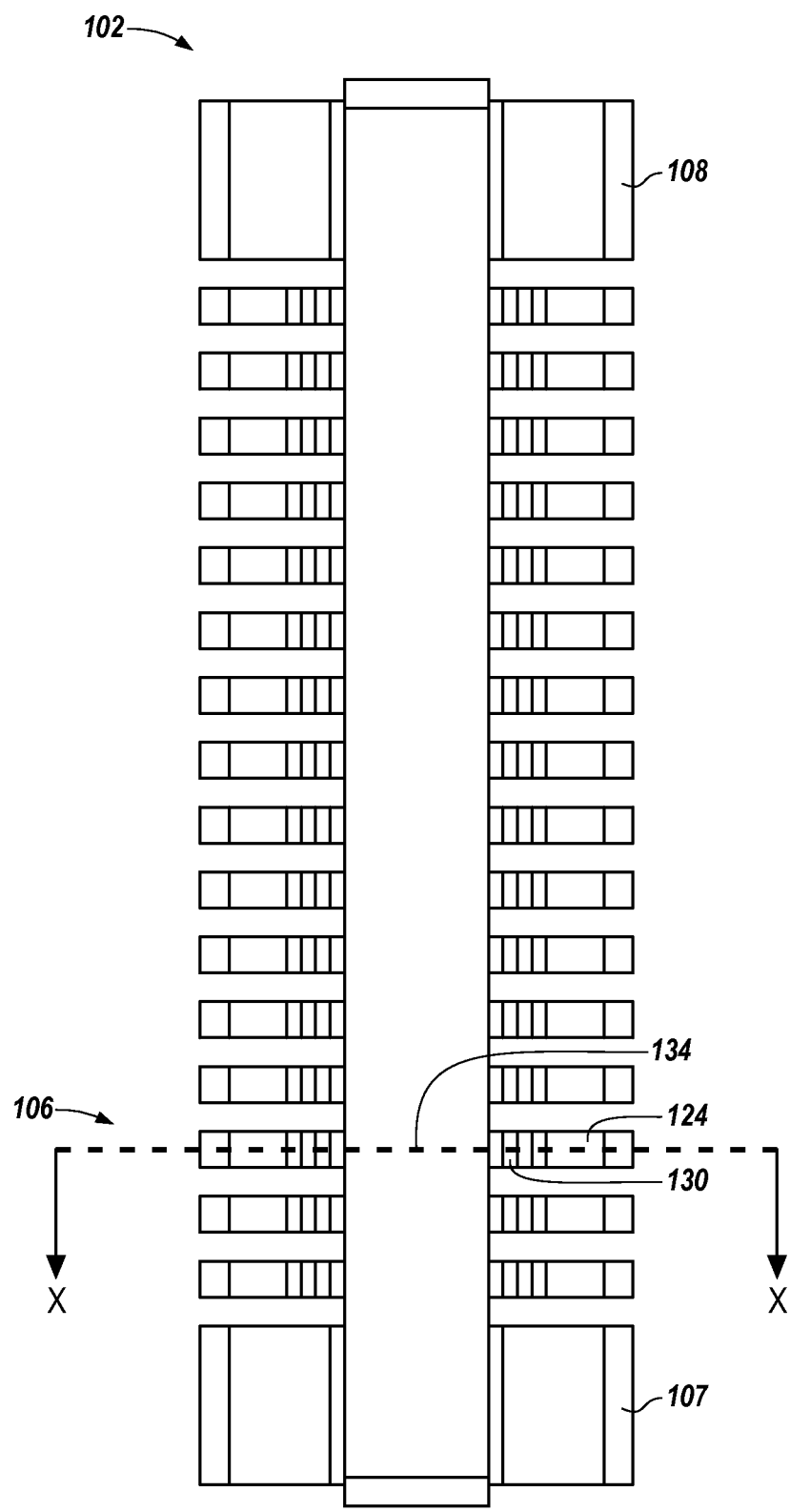
FIG. 1 is a cross-sectional view of a column of a non-volatile memory array taken along a vertical plane in accordance with a number of embodiments of the present disclosure.

Examples of the present disclosure provide devices and methods for processing a memory cell. A method embodiment includes removing a key-hole shaped column from a material to define a profile for the memory cell. The method also includes partially filling the key-hole shaped column with a first number of materials. The method further includes filling the remaining portion of the key-hole shaped column with a second number of materials.

As described herein, the gate coupling ratio (GCR) of a memory cell provided with a key-hole shaped profile (including a circularly shaped portion and at least one projecting portion) is greater than the GCR of a memory cell with a circularly shaped profile without a projecting portion, where the memory cells have circular portions with the same diameter and utilize the same materials. The key-hole shaped profile increases an interface area between the charge storage structure and the control gate (e.g., including dielectric(s) that may be between the charge storage structure and the control gate) without increasing a cross-section of a channel region. The interface area may be increased, in some embodiments, because the charge storage structure can extend into the projecting portion of the key-hole shaped profile. Increasing an interface area between a floating gate, for example, and the control gate can increase the capacitance between the floating gate and the control gate. Increasing the capacitance between the control gate and the floating gate can increase the GCR of a memory cell and lower a voltage required to program and erase the memory cell.

In the following detailed description of the present disclosure, reference is made to the accompanying drawings that form a part hereof, and in which is shown by way of illustration how some embodiments of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 322 may reference element "22" in FIG. 3, and a similar element may be referenced as 422 in FIG. 4.

FIG. 1 is a cross-sectional view of a column of a non-volatile memory array taken along a vertical plane in accordance with a number of embodiments of the present disclosure. The example of FIG. 1 illustrates a three-dimensional (3D) NAND architecture non-volatile memory (e.g., flash memory). However, examples described herein are not limited to this example. A memory array can include a plurality of columns. For example, a memory array can include a vertical column 102, however embodiments are not limited to this example of a 3D NAND architecture. In some embodiments a first column can be coupled to a second column by a horizontal portion such that the first column and the second column, and the horizontal portion form a "U" shape. The terms "vertical" and "horizontal" as used herein do not imply an absolute orientation, but are used as relative terms to describe one component with respect to another. A memory array can include a plurality of columns spaced apart (e.g., to the left and/or right of column 102, and/or those columns located into or out of the page in the 3D NAND architecture). A plurality of columns can be coupled to each other by control gates, among other components, which can run into and out of the page.

The column 102 can be coupled to a source line, which can be a common source line for other columns spaced apart from column 102 (e.g., into and out of the page). The column 102 can be coupled to a data line (e.g., a bit line) which can be a common bit line for other columns spaced apart from column 102 (e.g., to the left and/or right of column 102).

The columns can include a plurality of memory cells. In a number of embodiments, the memory cells can include a channel region, a charge storage structure, such as a floating gate, and a control gate. The memory cells can have their control gates coupled to a respective access (e.g., word) line. For example, the different materials that make up the columns can provide a control gate 124, a floating gate 130, and a poly pillar 134, among other components, which make up memory cells, such as memory cell 106. Control gates, floating gates, and a poly pillars can be made from conductor materials, among others, and can be separated by dielectric materials, among others. The memory cells in a column, such as the column 102, can be a string of memory cells, analogous to the strings of memory cells provided in 2D NAND architectures. Thus, for example, the memory cells in the column 102 can be coupled in series between a source select gate 107 and a drain select gate 108. Each source select gate can be configured to selectively couple a respective string to a common source responsive to a signal on a source select line coupled to the source select gate, while each drain select gate can be configured to selectively couple a respective string to a respective bit line responsive to a signal on a drain select line coupled to the drain select gate.

A sensing operation, such as a read or program verify operation, can include sensing a voltage and/or current change of a bit line coupled to a selected cell in order to determine the data state of the selected cell. The sensing operation can involve applying a signal to (e.g., driving or biasing) a bit line (e.g., data line) associated with a selected memory cell above a signal (e.g., bias voltage) applied to a source line associated with the selected memory cell. A sensing operation may include precharging the bit line followed with discharge when a selected cell begins to conduct, and sensing the discharge.

Sensing the data state of a selected cell can include applying a number of sensing signals (e.g., read voltages) to a selected word line while applying a number of pass signals (e.g., read pass voltages) to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the data state of a selected cell can be determined by the word line voltage at which the bit line current reaches a particular reference current associated with a particular data state.

In a sensing operation performed on a selected memory cell in a NAND string, the unselected memory cells of the string are biased so as to be in a conducting state. In such a sensing operation, the data state of the selected cell can be determined based on the current and/or voltage sensed on the bit line corresponding to the string. For instance, the data state of the selected cell can be determined based on whether the bit line current changes by a particular amount or reaches a particular level in a given time period. When the selected cell is in a conductive state, current flows between the source line contact at one end of the string and a bit line contact at the other end of the string. As such, the current associated with sensing the selected cell is carried through each of the other cells in the string and the select transistors.

Subsets of cells (in a SBL architecture) or all of the cells (in an ABL architecture) coupled to a selected word line can be programmed and/or sensed (e.g., read) together as a page of memory cells. A programming operation (e.g., a write operation) can include applying a number of programming pulses (e.g., 16V-20V) to a selected word line in order to increase the threshold voltage (Vt) of selected cells coupled to that selected word line to a desired program voltage level corresponding to a target (e.g., desired) data state.

An erase operation can include applying a relatively high potential difference between the control gates of the memory cells and their channel regions in order to remove charge (e.g., electrons) from the charge storages structures of the cells. In a NAND array, a block of memory cells including multiple pages of memory cells can be erased together in an erase operation. For example, 20V can be applied to the channel region and 0V can be applied to the control gates of the cells in a block of memory cells being erased. The high voltage erase pulse, or pulses, is intended to inject electrons from the charge storage structures of the memory cells into the channel region.

A memory cell's power consumption can be lowered by increasing the gate coupling ratio (GCR). GCR can be defined by the capacitor ratio between a tunnel dielectric capacitor and an inter-dielectric capacitor. In the embodiment shown in FIG. 1, the tunnel dielectric capacitor can be between the poly pillar 134 and the floating gate 130, and the inter dielectric capacitor can be between the control gate 124 and the floating gate 130, as described in more detail with respect to FIGS. 3A-3E below. Again with reference to the embodiment shown in FIG. 1, the gate coupling ratio can represent a voltage in the floating gate 130 induced by an external voltage applied to the control gate 124. When the coupling ratio is increased the voltage needed to program a memory cell is lowered. The coupling ratio can be increased by increasing the capacitance between the control gate 124 and the floating gate 130. Capacitance is the ability of a capacitor to store energy in an electrical field.

The capacitance between the control gate 124 and the floating gate 130 could be increased by increasing the sizes of both the control gate 124 and the floating gate 130 to yield an increased interface area between the control gate 124 and the floating gate 130. However, such an approach would decrease the memory density for an equivalently sized array. The embodiments shown in FIGS. 3-5 increase the GCR by increasing an interface area between a floating gate and a control gate without increasing a cross-sectional area of a poly pillar, for example, which in turn decreases the voltage needed to program and erase a memory cell while speeding up the same functions.

Figure 2:
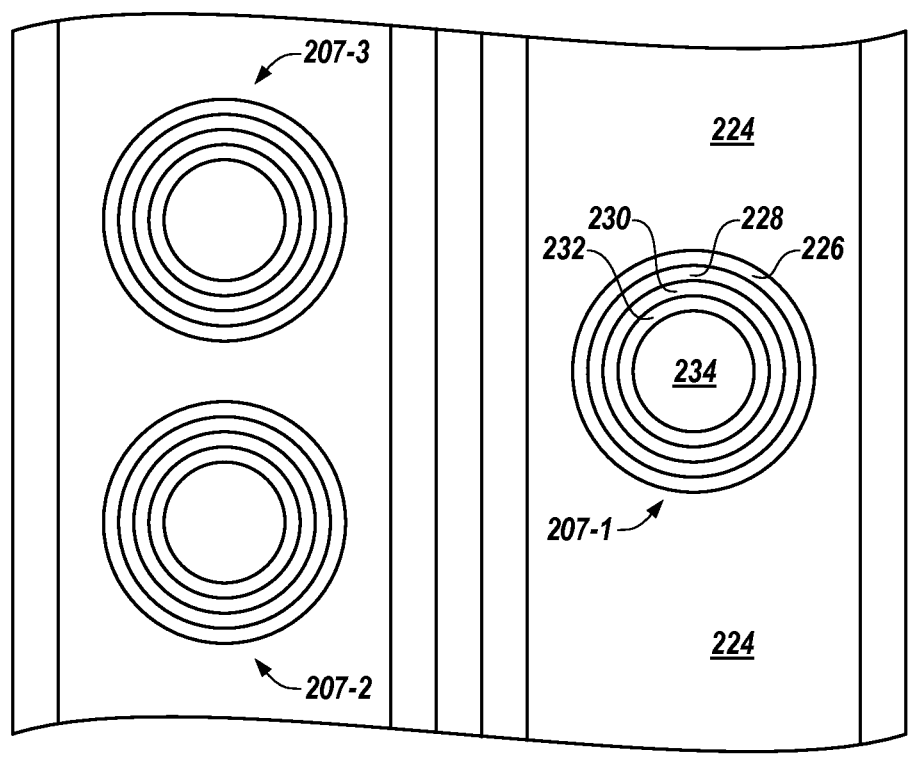
FIG. 2 is a cross-sectional view of a plurality of memory cells taken along a horizontal plane in accordance with some previous approaches.

FIG. 2 is a cross-sectional view of a plurality of memory cells taken along a horizontal plane in accordance with some previous approaches. The example of FIG. 2 illustrates memory cell 207-1, memory cell 207-2, and memory cell 207-3. In a 3D NAND architecture, memory cells may have a circular profile. For example, memory cell 207-1, memory cell 207-2, and memory cell 207-3 each have circular profiles. Memory cell 207-1 can include material 224 that can function as a control gate, material 230 that can function as a floating gate 230, and material 234 that can function as a channel region. Material 224, material 230, and material 234 can be separated by dielectric material 226, dielectric material 228, and dielectric material 232. In 3D floating gate flash memory the interface area between the floating gate 230 and the control gate 224 is limited by the circumference of a circularly shaped column of material 234. To modify the GCR of memory cells with circular profiles, the interface area between the floating gate 230 and the control gate 224 may be increased by increasing the width of the floating gate 230 and the control gate 224. However, increasing the width of the floating gate 230 and the control gate 224 may also lead to an increased overall width of the memory cells 216, which affects the overall size of the memory.

Figure 3A:
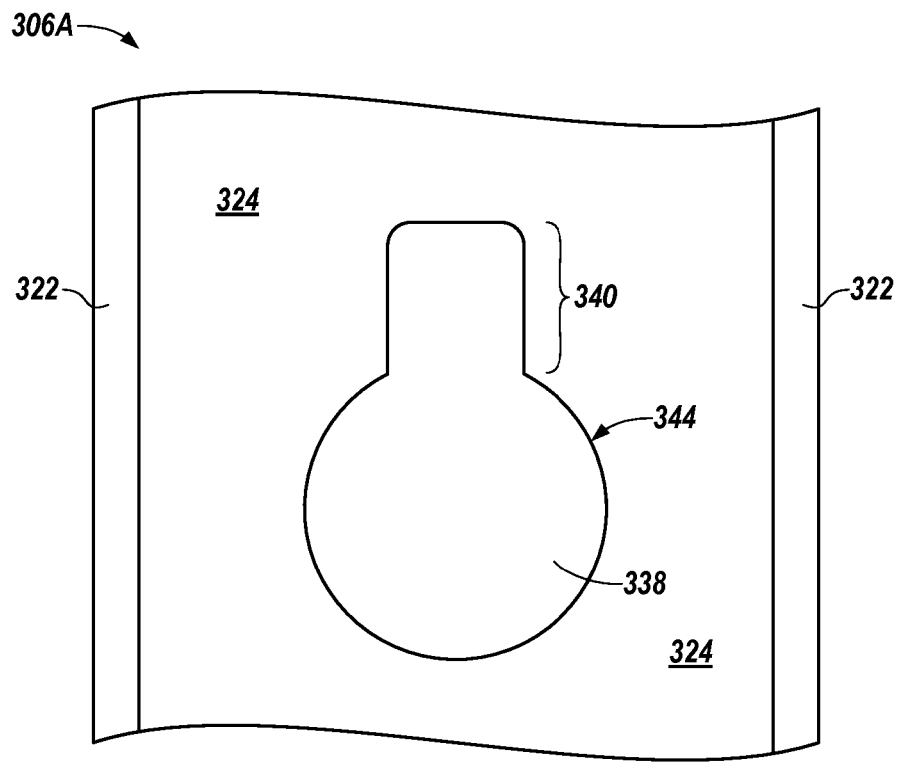
FIG. 3A is a cross-sectional view taken along cut line X-X in FIG. 1 of a key-hole shaped memory cell profile in a first process stage in accordance with a number of embodiments of the present disclosure.

FIG. 3A is a cross-sectional view taken along cut line X-X in FIG. 1 of a key-hole shaped memory cell profile in a first process stage in accordance with a number of embodiments of the present disclosure. Cut line X-X of FIG. 1 can represent a line in a "horizontal plane" as described above with respect to FIG. 2. FIG. 3A is not drawn to scale and can include a number of different materials that can have a number of different widths and/or size properties. FIG. 3A illustrates a key-hole shaped column 338 in material 324. Material 324 can function as a control gate through which a voltage can be applied to memory cell 306A (e.g., during operation of the memory cell after processing). In a number of embodiments, material 322 can lower the resistivity of material 324. Material 322 can be silicide and material 324 can be polysilicon, although material 322 and material 324 are not limited to the same.

In some embodiments a key-hole shaped column 338 can be removed from material 324 (e.g., by etching or another process). The key-hole shaped column 338 can include a circular portion 344 and another portion 340 projecting from the circular portion. In some embodiments, the key-hole shaped column 338 can be removed in a single stage. That is, the circular portion 344 and the projecting portion 340 of a key-hole shaped column 338 in the memory cell 306A can be removed in a single stage. The removing can be done through an etching process (e.g., reactive ion etching) or through a different process. In some embodiments the key-hole shaped column 338 can be removed in multiple stages. The removing process can include two stages such that the circular portion 344 and the projecting portion 340 of memory cell 306A can be removed in different stages. For example, the circular portion 344 can be removed in a first stage and the projecting portion 340 can be removed in a second stage. Likewise, the projecting portion 340 can be removed in a first stage, and the circular portion 344 can be removed in a second stage. The key-hole shaped column 338 can be removed to define a profile in which a charge storage structure and a channel region can be formed (e.g., deposited).

Figure 3B:
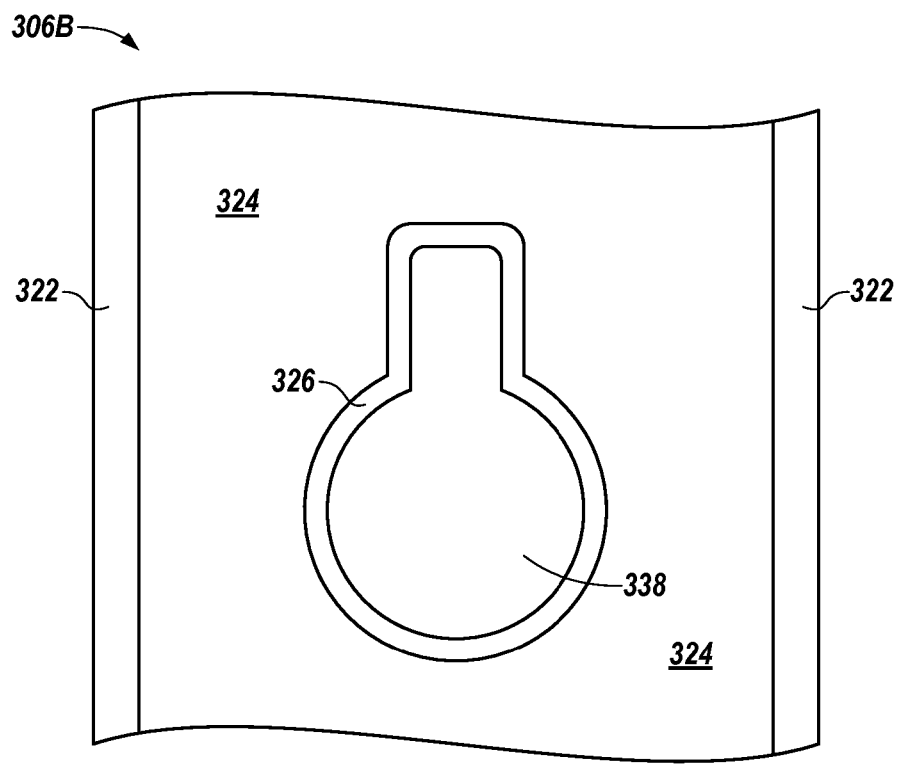
FIG. 3B is cross-sectional view taken along cut line X-X in FIG. 1 of a key-hole shaped memory cell profile in a process stage subsequent to the process stage illustrated in FIG. 3A.

FIG. 3B is cross-sectional view taken along cut line X-X in FIG. 1 of a key-hole shaped memory cell profile in a process stages subsequent to the process stage illustrated in FIG. 3A. FIG. 3B is not drawn to scale and can include a number of different materials that can have a number of different widths and/or size properties. In FIG. 3B, material 326 can be formed in the key-hole shaped column 338 in FIG. 3A. In some embodiments material 326 can be a dielectric material. For example, material 326 can be silicon oxide. In a number of embodiments material 326 can be conformally deposited (e.g., by an atomic layer deposition (ALD) process or another conformal deposition process). In some embodiments material 326 can be grown on the side walls of an underlying structure. Conformally depositing a material can allow the material to form on a top surface of an underlying structure as well as on the sidewalls of the underlying structure, such as on the sidewalls of trenches. After each formation (e.g., deposition), material 326 can be removed from the top surface of an underlying structure such that material 326 is only on the sidewalls of the underlying structure. In some instances, conformal deposition can give the material a consistent width as it is formed. For example, material 326 has a consistent width as it is formed in the key-hole shaped column 338 in FIG. 3A. The material 326 can provide a dielectric layer between material 324 (e.g., a control gate) and any other materials that may be formed at a later time (e.g., a floating gate). The dielectric material 326 can function to restrict the movement of electrons between the control gate and the floating gate in memory cell 306B (e.g., during operation of the memory cell after processing).

Figure 3C:
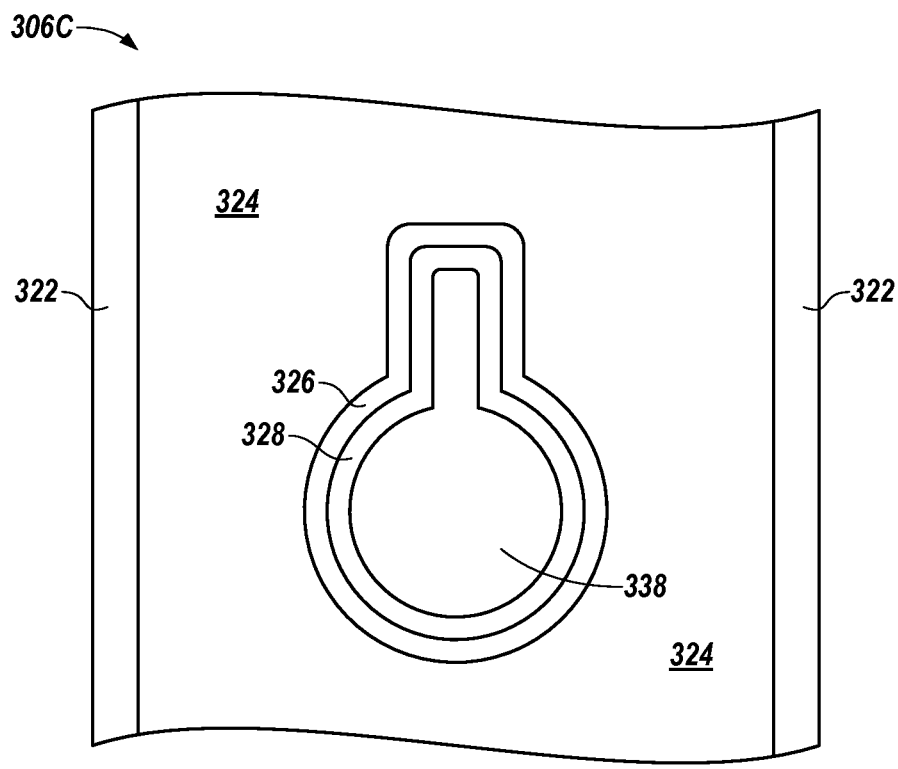
FIG. 3C is cross-sectional view taken along cut line X-X in FIG. 1 of a key-hole shaped memory cell profile in a process stage subsequent to the process stage illustrated in FIG. 3B.

FIG. 3C is cross-sectional view taken along cut line X-X in FIG. 1 of a key-hole shaped memory cell profile in a process stages subsequent to the process stage illustrated in FIG. 3B. FIG. 3C is not drawn to scale and can include a number of different materials that can have a number of different widths and/or size properties. In FIG. 3C, material 328 can be formed (e.g., deposited) in the key-hole shaped column 338 in FIG. 3B that is partially filled with material 326. In some embodiments material 328 can be conformally deposited on a top surface of an underlying structure as well as on the sidewalls of the underlying structure. After each formation (e.g., deposition), material 328 can be removed from the top surface of an underlying structure such that material 328 is only on the sidewalls of the underlying structure. In a number of embodiments material 328 can comprise a number of dielectric materials, such as silicon oxide and nitride, although material 328 is not limited to such. The material 328 can function to restrict the movement of electrons between the control gate and the floating gate in memory cell 306C (e.g., during operation of the memory cell after processing).

Figure 3D:
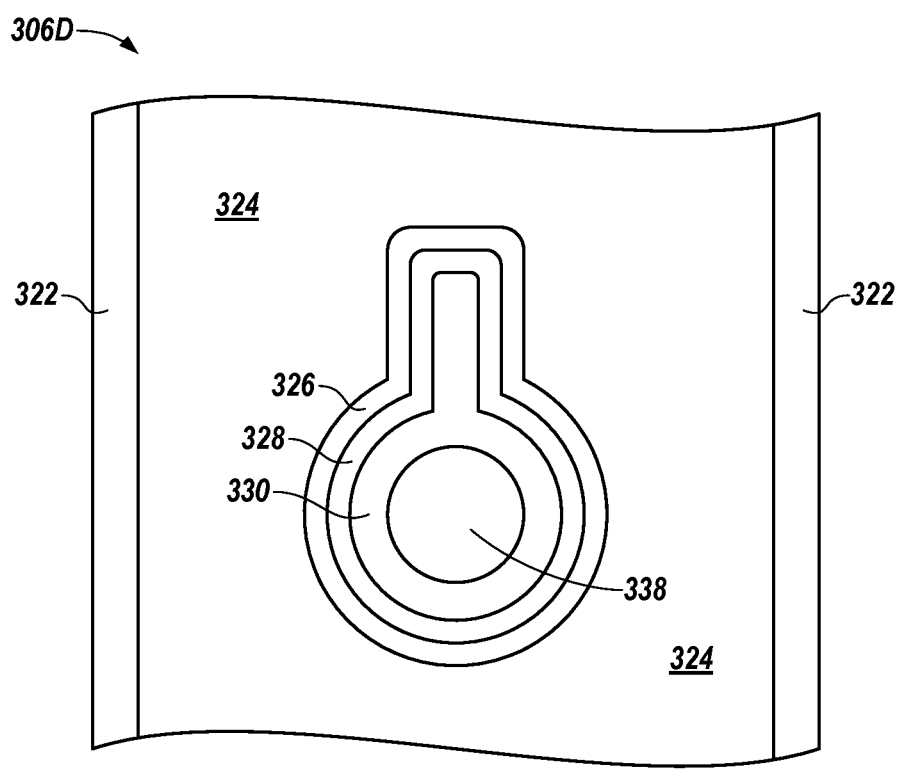
FIG. 3D is cross-sectional view taken along cut line X-X in FIG. 1 of a key-hole shaped memory cell profile in a process stage subsequent to the process stage illustrated in FIG. 3C.

FIG. 3D is cross-sectional view taken along cut line X-X in FIG. 1 of a key-hole shaped memory cell profile in a process stages subsequent to the process stage illustrated in FIG. 3C. FIG. 3D is not drawn to scale and can include a number of different materials that can have a number of different widths and/or size properties. In FIG. 3D, material 330 can be formed in the key-hole shaped column 338 in FIG. 3C that is partially filled with materials 326 and 328. Material 330 can be deposited (e.g., conformally deposited) with relation to material 328. After each formation (e.g., deposition), material 330 can be removed from the top surface of an underlying structure such that material 330 is only on the sidewalls of the underlying structure. In some embodiments material 330 can function as a charge storage material (e.g., floating gate) in memory cell 306C (e.g., during operation of the memory cell after processing). Material 330 can be a conductor material. For example, material 330 can be polysilicon although material 330 is not limited to the same. Furthermore, material 330 can be a doped conductor material. A doped conductor can be a p-type conductor or an n-type conductor. In FIG. 3D, after the formation of the material 330, the projecting portion of the key-hole shaped column is completely filled. Materials that may be subsequently deposited in the key-hole shaped column 338 (e.g., in the remaining circularly shaped portion of the key-hole shaped column 338) may not fill the projecting portion of the key-hole shaped column.

Figure 3E:
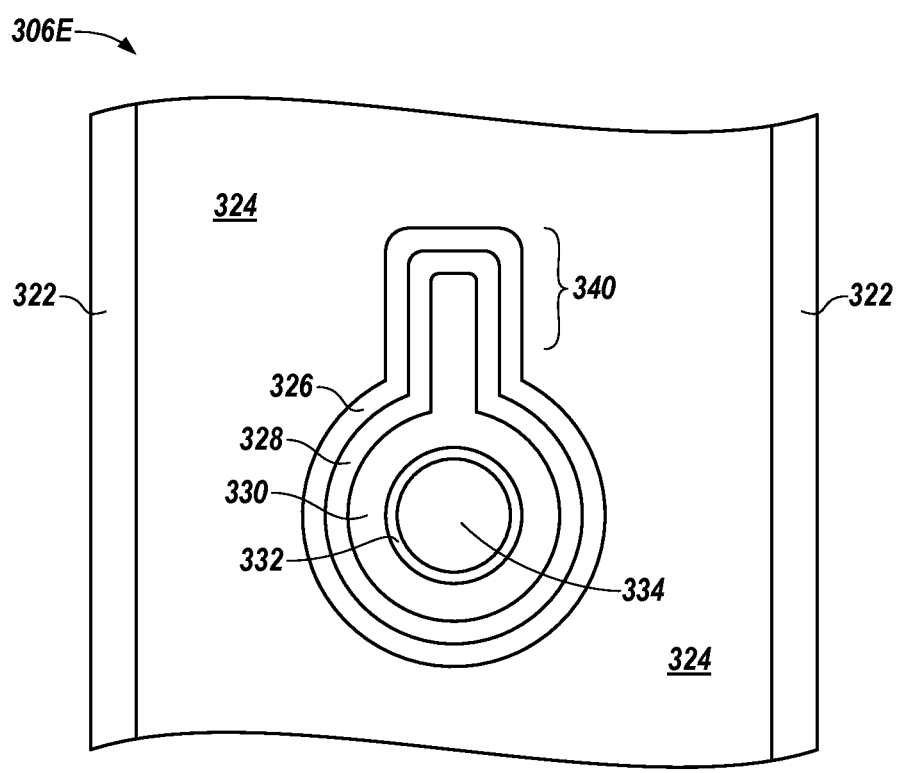
FIG. 3E is cross-sectional view taken along cut line X-X in FIG. 1 of a key-hole shaped memory cell profile in a process stage subsequent to the process stage illustrated in FIG. 3D.

FIG. 3E is cross-sectional view taken along cut line X-X in FIG. 1 of a key-hole shaped memory cell profile in a process stages subsequent to the process stage illustrated in FIG. 3D. FIG. 3E is not drawn to scale and can include a number of different materials that can have a number of different widths and/or size properties. In FIG. 3E, material 332 and material 334 can be formed (e.g., deposited) in the key-hole shaped column 338 in FIG. 3D (e.g., filling in the remaining circularly shaped portion of the key-hole shaped column 338) that is partially filled with materials 326, 328, and 330. In some embodiments material 332 can be conformally deposited into the circular portion of the key-hole shaped column after the projecting portion of the key-hole shaped column has been filled. After material 332 is conformally deposited, material 332 can be removed from the top surface of an underlying structure such that material 332 is only on the sidewalls of the underlying structure. Material 334 can be conformally deposited into the circular portion of the key-hole shaped column after material 332 has been removed from the top surface of an underlying structure. Material 332 and material 334 can be deposited in a circular shape and do not fill the projecting portion of the key-hole shaped column. In a number of embodiments material 332 can be a dielectric material and material 334 can be a conductor material. For example, material 332 can be silicon oxide and material 334 can be polysilicon. Material 334 can function as a channel region and may be formed as a pillar.

In some embodiments, the projecting portion 340 of the key-hole shaped memory cell profile can have a width proportional to the widths of material 326, material 328, and material 330 in the circular portion. That is, the projecting portion 340 of the key-hole shaped memory cell profile can have a width equal to approximately two times the sum of the widths of material 326, material 328, and material 330 in the circular portion. For example, if material 326 is silicon oxide and has a width of 10 nm when deposited, material 328 is silicon oxide and a nitride and has a width of 3 nm and 4 nm, and material 330 is polysilicon and has a width of 9 nm then the projecting portion of the key-hole shaped memory cell profile can have a width equal to 52 nm. The word, "approximately," with regards to the width of projecting portion 340, can indicate an allowance for processing imperfections. In some embodiments, the width of the projecting portion 340 of the key-hole shaped memory cell profile can be completely filled by material 326, material 328, and material 330.

In a number of embodiments a memory cell having a key-hole shaped profile can have a larger GCR than a memory cell having a circularly shaped profile (e.g., memory cell including a circularly shaped profile with a same diameter as the diameter of the circular portion of the key-hole shaped profile and utilizing the same materials). For example, memory cell 306E can have a larger GCR than memory cell 207-1 in FIG. 2 if the circular portion of memory cell 306E has a diameter that is equal to the diameter of memory cell 207-1. Memory cell 306E can include an outer portion and an inner portion. The outer portion can be composed of material 326, material 328, and material 330 and can include a portion of the circular portion of the key-hole shaped memory cell profile and the entire projecting portion 340. Material 330 can function as a charge storage structure (e.g., floating gate) while material 324 can function as a control gate. The inner portion can be composed of material 332 and material 334. Material 334 can function as a channel region.

An increased capacitance between the control gate and the floating gate can yield an increased coupling ratio. The capacitance between the control gate and the floating gate can be increased by increasing the total interface area between the floating gate and the control gate (e.g., by increasing an interface area between the control gate and the floating gate without increasing a cross-sectional area of the poly pillar). Memory cell 306E has a larger interface area between the control gate and the floating gate than the interface area between the control gate and the floating gate of the memory cell 207-1 because the outer portion of memory cell 306E has a larger cross-sectional area than the outer portion of memory cell 207-1. That is, the floating gate in memory cell 306E has a larger interface area with the control gate because the floating gate extends into the projecting portion 340 of the key-hole shaped memory cell profile.

Figure 4A:
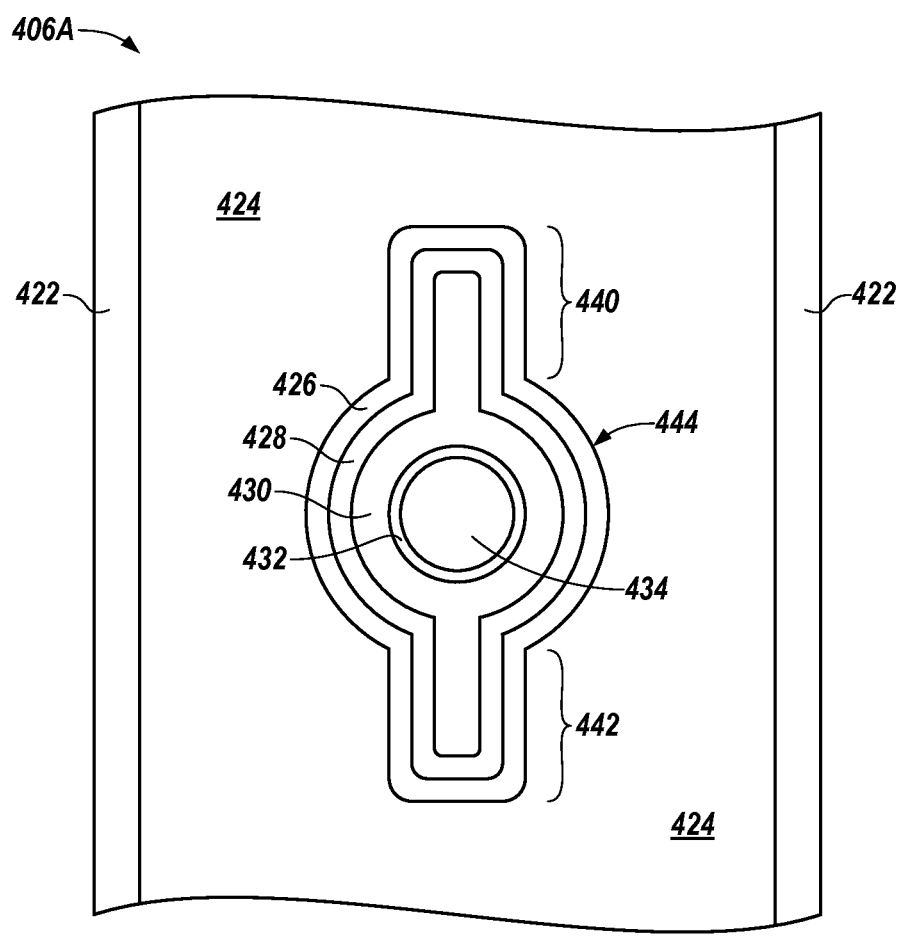
FIG. 4A is a cross-sectional view taken along cut line X-X in FIG. 1 of a key-hole shaped memory cell profile with two projecting portions in accordance with a number of embodiments of the present disclosure.

FIG. 4A is a cross-sectional view taken along cut line X-X of FIG. 1 of a key-hole shaped memory cell 406A with two projecting portions 440 and 442 in accordance with a number of embodiments of the present disclosure. The projecting portions of the key-hole shaped memory cell 406A can be projected from the circular portion 444 in any configuration. For example, the projecting portions can project from the circular portion 444 such that the portion 440 is projecting at 180 degrees from the portion 442.

In FIG. 4A, the memory cell 406A includes material 426, material 428, and material 430 which can be analogous to material 326, material 328, and material 330 respectively, in FIG. 3E. Furthermore, material 432 and material 434 can be analogous to material 332 and material 334 respectively, in FIG. 3E. In some embodiments the projecting portions 440 and 442 can have a width proportional to material 426, material 428, and material 430. For example, portions 440 and 442 can each have a width equal to approximately two times the sum of the widths of material 426, material 428, and material 430 in the circular portion 444. Forming material 426, material 428, and material 430 can completely fill the projecting portions 440 and 442. Subsequently, when material 432 and material 434 are formed, they are not formed in the projecting portions.

The GCR of a memory cell can be further increased, as compared to memory cell 306E in FIG. 3E, by increasing the number of projecting portions in a memory cell. For example, each projecting portion can increase the interface area between the floating gate and the control gate while the cross-sectional area of the poly pillar can remain constant. That is, a memory cell 406A with a two projection key-hole shaped profile can have a higher GCR than a memory cell (e.g., memory cell 306E) with a single projection key-hole shaped profile, assuming the same size projections and the hsame materials.

Figure 4B:
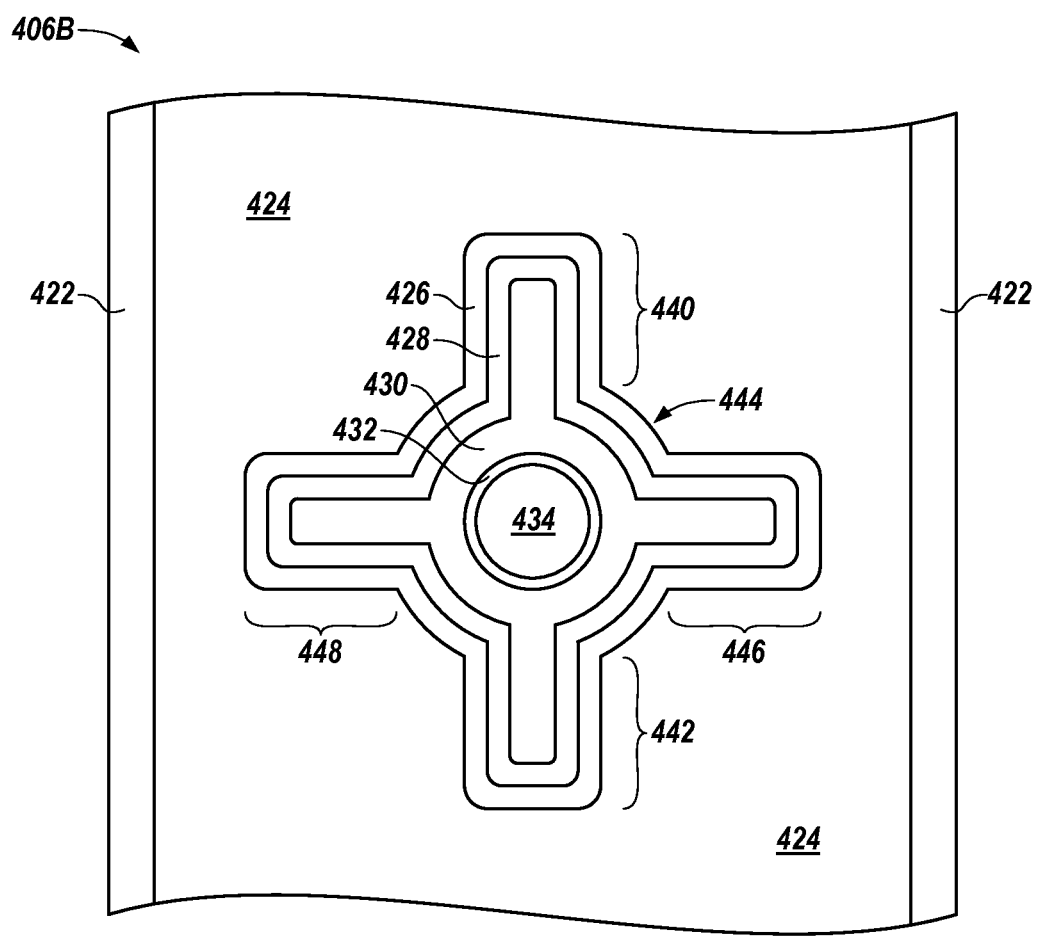
FIG. 4B is a cross-sectional view taken along cut line X-X in FIG. 1 of a key-hole shaped memory cell profile with four projecting portions in accordance with a number of embodiments of the present disclosure.

FIG. 4B is a cross-sectional view taken along cut line X-X of FIG. 1 of a key-hole (e.g., star) shaped memory cell 406B (e.g., a key-hole shaped memory cell having more than two projecting portions) in accordance with a number of embodiments of the present disclosure. FIG. 4B is not drawn to scale and can include a number of different materials that can have a number of different widths and/or size properties. In a number of embodiments, a star shaped memory cell profile can include, for example, a circular portion 444 and four projecting portions (e.g., projecting portion 440, projecting portion 442, projecting portion 446, and projecting portion 448) projecting from the circular portion 444 of the star shaped memory cell profile. The projecting portions of the star shaped memory cell profile can project from the circular portion 444 in a plurality of configurations. For example, the projecting portions can project from the circular portion 444 such that the four projecting portions are equally spaced around the circular portion 444.

In FIG. 4B, a memory cell 406B having a star shaped profile can include material 426, material 428, and material 430, which can be analogous to material 326, material 328, and material 330, respectively, in FIG. 3E. Furthermore, material 432 and material 434 can be analogous to material 332 and material 334 in FIG. 3E. In some embodiments the projecting portions can have a width proportional to material 426, material 428, and material 430. For example, the projecting portions of the star shaped memory cell can have a width equal to approximately two times the sum of the widths of material 426, material 428, and material 430 in the circular portion 444. Forming material 426, material 428, and material 430 can completely fill the projecting portions 440, 442, 446, and 448. Subsequently, when material 432 and material 434 are formed, they are not formed in the projecting portions.

In a number of embodiments, a memory cell can include more or fewer than four projecting portions. The examples described herein with regards to the number of projecting portions projecting from a circular portion are illustrative rather than limiting. Furthermore, the projecting portions described herein are illustrated as rectangularly shaped portions but are not limited to such and can include a number of other shapes. Moreover, FIGS. 4A and 4B are not drawn to scale and can include a number of different materials that can have a number of different widths and/or size properties.

Figure 5:
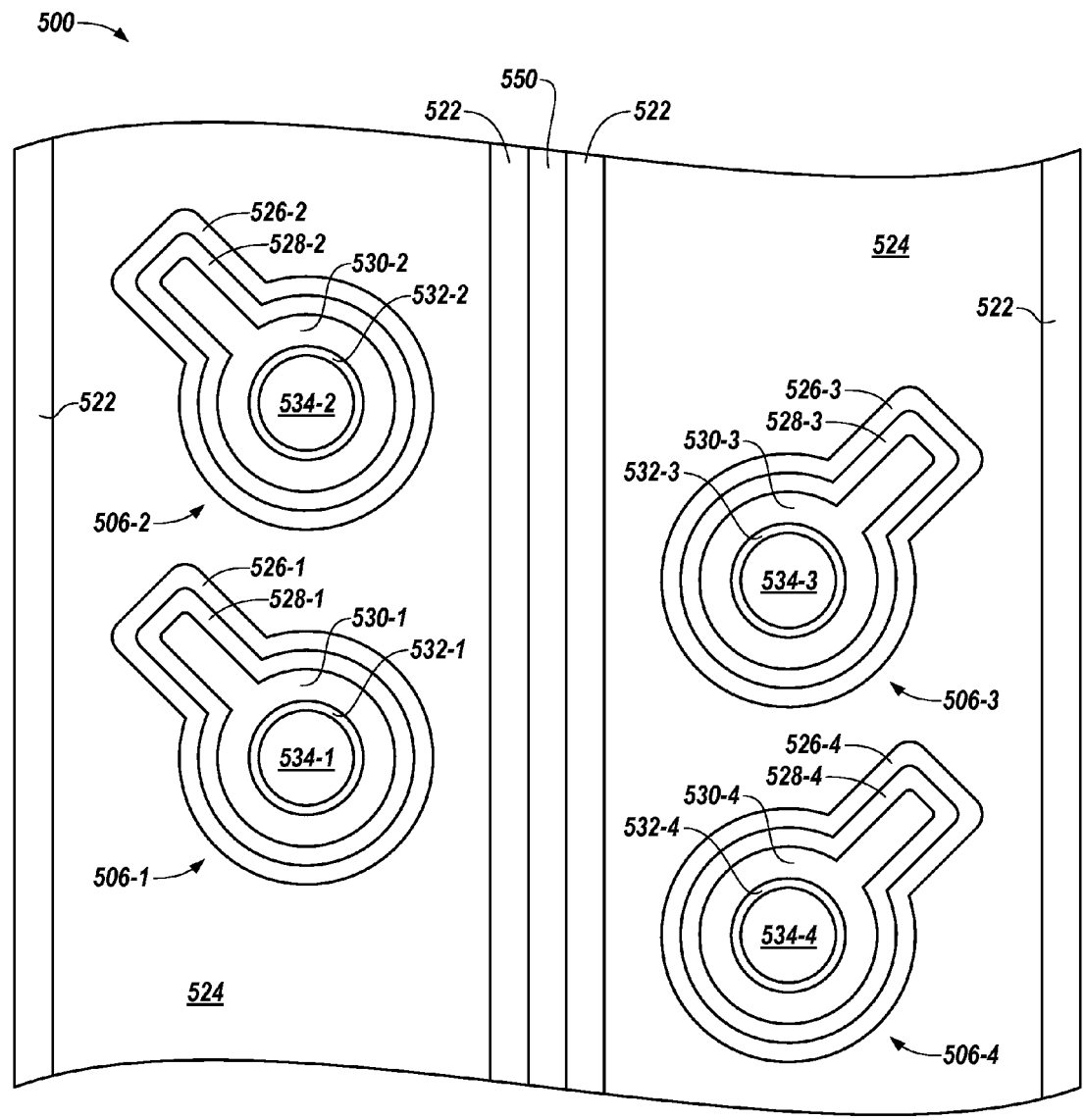
FIG. 5 is a cross-sectional view taken along a horizontal plane of a number of memory cells in a portion of a memory array in accordance with a number of embodiments of the present disclosure.

FIG. 5 is a cross-sectional view taken along a horizontal plane of a number of memory cells in a portion of a memory array in accordance with a number of embodiments of the present disclosure. FIG. 5 is not drawn to scale and can include a number of different materials that can have a number of different widths and/or size properties. A memory array can include of a number of columns each of which can include a number of memory cells. The placement of the columns and their alignment can impact the utilization of space and the size of the memory (e.g., memory chip). In some embodiments, the size of the memory (e.g., memory chip) can be optimized by altering the placement of the columns in which the memory cells having key-hole shaped profiles. For example, memory array 500 illustrates four memory cells (e.g., memory cell 506-1, memory cell 506-2, memory cell 506-3, and memory cell 506-4). Memory cell 506-1 and memory cell 506-2 can be isolated from memory cell 506-3 and memory cell 506-4 by material 550. Material 550 can function to isolate the control gate that corresponds to memory cell 506-1 and memory cell 506-2 from the control gate that corresponds to memory cell 506-3 and memory cell 506-4. In a number of embodiments, the memory cells can have a key-hole shaped profile. In some embodiments, the key-hole shaped profile could be a star shaped profile. In various embodiments, some memory cells can have a star shaped profile while other memory cells have a single or two projection key-hole shaped profile. Other combinations of profile shapes can be provided, including circularly shaped memory cell profiles, among others.

In a number of embodiments, the memory cells (e.g., memory cell 506-1, memory cell 506-2, memory cell 506-3, and memory cell 506-4) can include material 522, material 524, material 526 (e.g., material 526-1, material 526-2, material 526-3, material 526-4), material 528 (e.g., material 528-1, material 528-2, material 528-3, material 528-4), material 530 (e.g., material 530-1, material 530-2, material 530-3, material 530-4), material 532 (e.g., material 532-1, material 532-2, material 532-3, material 532-4), and material 534 (e.g., material 534-1, material 534-2, material 534-3, material 534-4), which can be analogous to material 322, material 324, material 326, material 328, material 330, material 332, and material 334 respectively, in FIG. 3E. For example, material 526 can be silicon oxide, material 528 can be silicon oxide and nitride, material 530 can be polysilicon, material 532 can be silicon oxide, and material 534 can be polysilicon.

In memory array 500 the memory cells can be configured in a configuration such that the projecting portions do not require the columns to be spaced further apart than they would be if all of the columns were circularly shaped. For example, each of memory cell 506-1, memory cell 506-2, memory cell 506-3, and memory cell 506-4, can have a projecting portion and a circular portion and can be arranged such that memory cell 506-1 and memory cell 506-2 are aligned in a first line. Furthermore, memory cell 506-3 and memory cell 506-4 can be arranged in a second line such that the first line is parallel to the second line. Memory cell 506-3 can be at an equal distance from memory cell 506-1 and from memory cell 506-2. The projecting portions of memory cell 506-1 and memory cell 506-2 can be oriented away from memory cell 506-3 and memory cell 506-4 while the projecting portions of memory cell 506-3 and memory cell 506-4 can be oriented away from memory cell 506-1 and memory cell 506-2.

CONCLUSION

Devices and methods for processing memory cells have been shown. One method example includes removing a key-hole shaped column from a material, to define a profile for the memory cell. The method also includes partially filling the key-hole shaped column with a first number of materials. The method further includes filling the remaining portion of the key-hole shaped column with a second number of materials.

Although specific examples have been illustrated and described herein, those of ordinary skill in the art will appreciate that an arrangement calculated to achieve the same results can be substituted for the specific examples shown. This disclosure is intended to cover adaptations or variations of some examples of the present disclosure. It is to be understood that the above description has been made in an illustrative fashion, and not a restrictive one. Combination of the above examples and other examples not specifically described herein will be apparent to those skilled in the art upon reviewing the above description. The scope of the examples of the present disclosure includes other applications in which the above structures and methods are used. Therefore, the scope of some examples of the present disclosure should be determined with reference to the appended claims, along with the full range of equivalents to which such claims are entitled.

In the foregoing Detailed Description, some features are grouped together in single examples for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed embodiment. Thus, each claim standing on its own as a separate example.

What is claimed is:

1. A method of processing a memory cell, comprising:
   removing a column from a material to define a profile for the memory cell, wherein the memory cell has a cross-sectional shape in a plane perpendicular to the column including a circular portion and at least one projecting rectangular portion;
   partially filling an outer portion of the column including the circular portion and the at least one projecting rectangular portion with a first number of materials, wherein one of the first number of materials comprises a charge storage material; and
      filling a remaining portion of the column with a second number of materials.

2. The method of claim 1, wherein removing the column comprises:
   removing the circular portion in a first stage; and
   removing the at least one projecting rectangular portion in a second stage.

3. The method of claim 1, wherein filling the outer portion of the column with the first number of materials comprises:
   partially filling the column from the outer portion of the column towards an inner portion of the column.

4. The method of claim 3, wherein filling the remaining portion of the column with the second number of materials comprises:
   filling the inner portion of the column including the circular portion and the at least one projecting rectangular portion from the outer portion towards the inner portion.

5. The method of claim 1, wherein removing the column comprises removing the column through a reactive ion etching process.

6. The method of claim 1, further comprising removing the column in a single stage.

7. The method of claim 1, wherein removing the at least one projecting rectangular portion comprises removing a first projecting rectangular portion and a second projecting rectangular portion at opposite ends of the circular portion.

8. The method of claim 1, wherein the first number of materials further include a first dielectric material and a second dielectric material and the second number of materials include a third dielectric material and a conductor material.

9. The method of claim 8, wherein the conductor material comprises a polysilicon, the first and the third dielectric materials comprise an oxide, and the second dielectric material comprises one of an oxide and a nitride.

10. A three-dimensional memory device comprising:
    a plurality of memory cells in a column formed in a first material, wherein the plurality of memory cells have a cross-sectional shape in a plane perpendicular to the column including a circular portion and at least one projecting rectangular portion, wherein:
       an outer portion of the column including the circular portion and the at least one projecting rectangular portion includes a first number of materials formed therein, wherein one of the first number of materials comprises a charge storage material; and
    an inner portion of the column includes a second number of materials formed therein.

11. The device of claim 10, wherein the inner portion of the column includes the circular portion and the outer portion of the column includes the circular portion and the projecting rectangular portion.

12. The device of claim 10, wherein at least one of the second number of materials is formed only in the circular portion of the column.

13. The device of claim 10, wherein the plurality of memory cells have a plurality of projecting rectangular portions are spaced apart around the circular portion.

14. The device of claim 10, wherein the charge storage material comprises polysilicon.

15. A three-dimensional memory device comprising:
    a plurality of memory cells in a plurality of columns formed in a material, wherein the plurality of memory cells each have a cross-sectional shape in a plane perpendicular to the plurality of columns including a circular portion and a projecting rectangular portion, wherein:
       a first column and a second column of the plurality columns are aligned in a first line;
       a third column and a fourth column of the plurality columns are aligned in a second line; and
       wherein the first line is parallel to the second line;
       wherein the projecting rectangular portions of the memory cells in the first column and second column are oriented in a first direction; and
       wherein the projecting rectangular portions of the memory cells in the third column and fourth column are oriented in a second direction different than the first direction.

16. The device of claim 15, wherein the material comprises a first conductor material and wherein the plurality of columns include:
    an outer portion that comprises a first dielectric material, a second dielectric material, and a second conductor material; and
    an inner portion that comprises a third dielectric material and a third conductor material.

17. The device of claim 16, wherein the first dielectric material is conformal to the first conductor material, the second dielectric material is conformal to the first dielectric material, the second conductor material is conformal to the second dielectric material, the third dielectric material is conformal to the second conductor material, and the third conductor material is conformal to the third dielectric material.

18. The device of claim 16, wherein the second conductor material is a charge storage material.

19. The device of claim 15, wherein the third column is positioned at an equal distance from the first and the second columns.

* * * * *